US011723280B2

(12) United States Patent
Tajitsu et al.

(10) Patent No.: US 11,723,280 B2
(45) Date of Patent: Aug. 8, 2023

(54) ELECTRETIZED FILM AND ELECTRONIC DEVICE

(71) Applicants: MITSUI CHEMICALS, INC., Tokyo (JP); THE SCHOOL CORPORATION KANSAI UNIVERSITY, Suita (JP)

(72) Inventors: Yoshiro Tajitsu, Suita (JP); Yuzo Nakamura, Chiba (JP); Tomoya Matayoshi, Ichihara (JP); Takayuki Watanabe, Chiba (JP); Michio Eriguchi, Chiba (JP)

(73) Assignees: MITSUI CHEMICALS, INC., Tokyo (JP); THE SCHOOL CORPORATION KANSAI UNIVERSITY, Suita (JP)

( * ) Notice: Subject to any disclaimer, the term of this patent is extended or adjusted under 35 U.S.C. 154(b) by 970 days.

(21) Appl. No.: 16/490,154

(22) PCT Filed: Mar. 1, 2018

(86) PCT No.: PCT/JP2018/007810
§ 371 (c)(1),
(2) Date: Aug. 30, 2019

(87) PCT Pub. No.: WO2018/159765
PCT Pub. Date: Sep. 7, 2018

(65) Prior Publication Data
US 2020/0061669 A1    Feb. 27, 2020

(30) Foreign Application Priority Data

Mar. 3, 2017 (JP) ................................ 2017-041001

(51) Int. Cl.
*H01L 41/193* (2006.01)
*H10N 30/857* (2023.01)
*B06B 1/02* (2006.01)

(52) U.S. Cl.
CPC .......... *H10N 30/857* (2023.02); *B06B 1/0292* (2013.01)

(58) Field of Classification Search
CPC .. H10N 30/857; B06B 1/0292; C08J 2323/08; C08J 5/18; H01G 7/028; H01G 7/021; H01L 41/193
See application file for complete search history.

(56) References Cited

U.S. PATENT DOCUMENTS

| 6,489,033 | B1 | 12/2002 | Hatke et al. |
| 9,381,724 | B2 | 7/2016 | Koike et al. |
| 2008/0203619 | A1 | 8/2008 | Lanceros-Mendez et al. |
| 2012/0177907 | A1 | 7/2012 | Koike et al. |
| 2014/0117272 | A1 | 5/2014 | Yu et al. |
| 2015/0015120 | A1 | 1/2015 | Kaimori et al. |
| 2016/0190431 | A1* | 6/2016 | Zeng ...................... H01L 41/45 29/25.35 |

FOREIGN PATENT DOCUMENTS

| JP | 2002505034 A | 2/2002 |
| JP | 2011084735 A | 4/2011 |
| JP | 2011086924 A | 4/2011 |
| JP | 2012122041 A | 6/2012 |
| JP | 2014141651 A | 8/2014 |

OTHER PUBLICATIONS

Extended European Search Report dated Nov. 26, 2020, by the European Patent Office in corresponding European Patent Application No. 18760815.3. (10 pages).
Savijärvi et al., "Novel Heat Durable Electromechanical Films: Cellular Film Making From Cyclic Olefin Polymers," Electrets, 2005, pp. 75-78.
Wegener et al., "Voided Cyclo-Olefin Polymer Films Ferrolectrets with High Thermal Stability," Electrets, 2005, pp. 47-50.
International Search Report (PCT/ISA/210) and translation and Written Opinion (PCT/ISA/237) dated May 22, 2018, by the Japanese Patent Office as the International Searching Authority for International Application No. PCT/JP2018/007810.

* cited by examiner

*Primary Examiner* — Su C Kim
(74) *Attorney, Agent, or Firm* — Buchanan Ingersoll & Rooney PC

(57) ABSTRACT

An electretized film of the present invention includes a cyclic olefin polymer, in which the electretized film is a non-porous film, and a piezoelectric constant $d_{33}$ in a thickness direction, which is measured by applying a pressing force to the electretized film in the thickness direction, under conditions of a load of 0.5 N, a dynamic load of ±0.25 N, a frequency of 110 Hz, a temperature of 23° C., and a humidity of 50%, is equal to or more than 100 pC/N.

11 Claims, No Drawings

ELECTRETIZED FILM AND ELECTRONIC DEVICE

TECHNICAL FIELD

The present invention relates to an electretized film and an electronic device.

BACKGROUND ART

An electretized film is a film which holds charges internally even in a state of absence of an electric field on an outside to form the electric field to the outside.

Examples of a technique relating to the electretized film include those described in Patent Document 1 (Japanese Unexamined Patent Application Publication No. 2012-122041) and Patent Document 2 (Japanese Unexamined Patent Application Publication No. 2011-84735).

Patent Document 1 describes a porous resin sheet for a piezoelectric pyroelectric element of which a glass transition point or a softening point is equal to or higher than 120° C. and a Water absorptivity is equal to or less than 0.2%.

In addition, Patent Document 2 describes an electretized film including a core layer (A) formed of a thermoplastic resin stretched film containing 50% to 88% by weight of a thermoplastic resin and 50% to 12% by weight of an inorganic powder, in which a film, in which the core layer (A) includes pores having a height of 3 to 30 μm in a thickness direction of the film and a diameter of 50 to 500 μm in a surface direction of the film, by a frequency of 100 to 3,000 pores/mm² when observing a section in a thickness direction, is electretized by subjecting to a high voltage DC discharge treatment.

RELATED DOCUMENT

Patent Document

[Patent Document 1] Japanese Unexamined Patent Publication No. 2012-122041
[Patent Document 2] Japanese Unexamined Patent Publication No. 2011-84735

SUMMARY OF THE INVENTION

Technical Problem

Although a porous electretized film as described in Patent Documents 1 and 2 can retain a large number of charges in the pores inside the film, the charges are easily attenuated at a high temperature, and charge retention property at the high temperature was not satisfactory sufficient.

Therefore, an electronic device using the porous electretized film of the related art has a room for improvement in points of sensitivity and long-term reliability.

The present invention is made in view of the circumstances, and is to provide an electretized film capable of realizing an electronic device excellent in the sensitivity and the long-term reliability.

Solution to Problem

The present inventors intensively studied to achieve the above objects. As a result, it was found that when while selecting a cyclic olefin polymer as a resin that forms an electretized film, the film is formed to be non-porous and a piezoelectric constant $d_{33}$ measured under a specific condition is set to be equal to or more than a specific value, it is possible to obtain an electretized film capable of realizing an electronic device excellent in sensitivity and long-term reliability. Accordingly, the present invention was completed.

According to the present invention, there are provided an electretized film and an electronic device shown below.

[1]
An electretized film including:
a cyclic olefin polymer,
in which the electretized film is a non-porous film, and
a piezoelectric constant $d_{33}$ in a thickness direction, which is measured by applying a pressing force to the electretized film in the thickness direction, under conditions of a load of 0.5 N, a dynamic load of ±0.25 N, a frequency of 110 Hz, a temperature of 23° C., and a humidity of 50%, is equal to or more than 100 pC/N.

[2]
The electretized film according to [1], in which a content of an inorganic filler in the electretized film is equal to or less than 10% by mass when an entirety of the electretized film is set as 100% by mass.

[3]
The electretized film according to [1] or [2], in which a glass transition temperature of the electretized film is equal to or higher than 100° C. and equal to or lower than 220° C.

[4]
The electretized film according to any one of [1] to [3], in which a moisture permeance of the electretized film, which is measured under conditions of a temperature of 40° C. and a humidity of 90% RH according to JIS Z 0208, is equal to or less than 0.5 g·mm/m²·day.

[5]
The electretized film according to any one of [1] to [4], in which water absorptivity of the electretized film when immersed in water at a temperature of 23° C. for 24 hours, which is measured according to ASTM D570 is equal to or less than 0.1% by mass.

[6]
The electretized film according to any one of [1] to [5], in which haze of the electretized film, which is measured according to JIS K 7136, is equal to or less than 10%.

[7]
The electretized film according to any one of [1] to [6], in which a dielectric constant of the electretized film at a frequency of 1 MHz is equal to or less than 3.0.

[8]
The electretized film according to any one of [1] to [7], in which when the electretized film is subjected to a heat resistance test in which the electretized film is allowed to stand in a nitrogen atmosphere at 100° C. for 100 hours, the piezoelectric constant $d_{33}$ in the thickness direction of the electretized film before the heat resistance test is set as $D_0$, and the piezoelectric constant $d_{33}$ in the thickness direction of the electretized film after the heat resistance test is set as $D_1$, $D_1/D_0$ is equal to or more than 0.60 and equal to or less than 1.1.

[9]
The electretized film according to any one of [1] to [8], in which a thickness is equal to or more than 5 μm and equal to or less than 500 μm.

[10]
The electretized film according to any one of [1] to [9], which is used for a piezoelectric panel, a pressure sensor, a haptic device, a piezoelectric vibration power generator, an electrostatic induction power generator, a flat speaker, or an ultrasonic wave generator.

[11]

An electronic device using the electretized film according to any one of [1] to [10]

[12]

The electronic device according to [11], which is a piezoelectric panel, a pressure sensor, a haptic device, a piezoelectric vibration power generator, an electrostatic induction power generator, a flat speaker, or an ultrasonic wave generator.

Advantageous Effects of Invention

According to the present invention, it is possible to provide an electretized film capable of realizing an electronic device excellent in sensitivity and long-term reliability.

DESCRIPTION OF EMBODIMENTS

Hereinafter, the present invention will be described based on embodiments. In the present embodiment, unless otherwise specified, "A to B" indicating a numerical range represents equal to or more than A and equal to or less than B.

<Electretized Film>

An electretized film according to the present embodiment is a non-porous film including a cyclic olefin polymer. Then, from a viewpoint of making sensitivity of an electronic device to be obtained favorable, in the electretized film according to the present embodiment, a piezoelectric constant $d_{33}$ in a thickness direction, which is measured by applying a pressing force to the electretized film in the thickness direction, under conditions of a load of 0.5 N, a dynamic load of ±0.25 N, a frequency of 110 Hz, a temperature of 23° C., and a humidity of 50%, is equal to or more than 100 pC/N, more preferably equal to or more than 150 pC/N, and still more preferably equal to or more than 180 pC/N.

In addition, an upper limit of the piezoelectric constant $d_{33}$ the thickness direction is not particularly limited, but is preferably equal to or less than 500 pC/N, more preferably equal to or less than 400 pC/N, and still more preferably equal to or less than 300 pC/N, from a viewpoint of making charge retention property at a high temperature more favorable.

According to studies of the present inventors, it was found that although a porous electretized film can retain a large number of charges in pores inside a film, the charges are easily attenuated at a high temperature, and the charge retention property at the high temperature was not satisfactory sufficient.

Then, the present inventors further intensively studied based on the above findings. As a result, it was found that the non-porous film including the cyclic olefin polymer is excellent in the charge retention property at a high temperature and possible to make the long-term reliability of the electronic device to be obtained favorable.

Furthermore, according to studies of the present inventors, it was found that when the piezoelectric constant $d_{33}$ in the thickness direction of the non-porous film including the cyclic olefin polymer is set to be equal to or more than 100 pC/N or more, it is possible to make the sensitivity of the electronic device to be obtained favorable.

In order to achieve the piezoelectric constant $d_{33}$, as will be described later, it is important to devise a method of corona charge treatment to the non-porous film including the cyclic olefin polymer.

From a viewpoint of making flexibility and transparency more favorable, in the electretized film according to the present embodiment, a content of an inorganic filler in the electretized film is preferably equal to or more than 0% by mass and equal to or less than 10% by mass, more preferably equal to or more than 0% by mass and equal to or less than 5% by mass, and particularly preferably equal to or more than 0% by mass and equal to or less than 1% by mass, when an entirety of the electretized film is set as 100% by mass.

Examples of the inorganic filler include calcium carbonate, calcined clay, silica, diatomaceous earth, white clay, talc, titanium oxide, barium sulfate, alumina, zeolite, mica, sericite, bentonite, sepiolite, vermiculite, dolomite, wollastonite, and glass fiber.

From the viewpoint of further improving the charge retention property at a high temperature, in the electretized film according to the present embodiment, a glass transition temperature is preferably equal to or higher than 100° C., more preferably equal to or higher than 110° C., and particularly preferably equal to or higher than 120° C.

In addition, from the viewpoint of improving the flexibility and transparency, in the electretized film according to the present embodiment, the glass transition temperature is preferably equal to or lower than 220° C., more preferably equal to or lower than 200° C., and particularly preferably equal to or lower than 180° C.

From viewpoints of further improving the charge retention property under high temperature and high humidity, and obtaining an electronic device more excellent in long-term reliability, in the electretized film according to the present embodiment, a moisture permeance measured under conditions of a temperature of 40° C. and a humidity of 90% RH according to JIS Z 0208, is preferably equal to or less than 0.5 g·mm/m²·day, more preferably equal to or less than 0.3 g·mm/m²·day or less, and still more preferably equal to or less than 0.2 g mm/m²·day. A lower limit of the moisture permeance of the electretized film according to the present embodiment is not particularly limited, and is, for example, equal to or more than 0.001 g·mm/m²·day.

From the viewpoints of further improving the charge retention property under high temperature and high humidity, and obtaining an electronic device more excellent in long-term reliability, in the electretized film according to the present embodiment, water absorptivity when immersed in water at a temperature of 23° C. for 24 hours, which is measured according to ASTM D570 is preferably equal to or less than 0.1% by mass and more preferably equal to or less than 0.05% by mass. A lower limit of the water absorptivity of the electretized film according to the present embodiment is not particularly limited, and is, for example, equal to or more than 0.0001% by mass.

From the viewpoint of improving the transparency, in the electretized film according to the present embodiment, haze measured according to JIS K 7136 is preferably equal to or less than 10%, more preferably equal to or less than 5%, still more preferably equal to or less than 1%, and particularly preferably equal to or less than 0.5%.

From the viewpoints of further improving the charge retention property at a high temperature, and obtaining an electronic device more excellent in the long-term reliability, in the electretized film according to the present embodiment, when the electretized film is subjected to a heat resistance test in which the electretized film is allowed to stand in a nitrogen atmosphere at 100° C. for 100 hours, the piezoelectric constant $d_{33}$ in the thickness direction of the electretized film before the heat resistance test is set as $D_0$, and the piezoelectric constant $d_{33}$ in the thickness direction of the electretized film after the heat resistance test is set as $D_1$, $D_1/D_0$ is preferably equal to or more than 0.60 and equal to or less than 1.1, more preferably equal to or more than 0.80 and equal to or less than 1.1, and still more preferably equal to or more than 0.90 and equal to or less than 1.1.

A thickness of the electretized film according to the present embodiment is not particularly limited, and is, for example, equal to or more than 5 μm and equal to or less than 500 μm, preferably equal to or more than 10 μm and equal to or less than 300 μm, and more preferably equal to or more than 15 μm and equal to or less than 200 μm. When the thickness of the electretized film according to the present embodiment is within the range, the balance of mechanical property, handleability, formability, and the like is more excellent.

(Cyclic Olefin Polymer)

The electretized film according to the present embodiment includes the cyclic olefin polymer.

Examples of the cyclic olefin polymer include at least one selected from a copolymer of ethylene or α-olefin and cyclic olefin and a ring-opened polymer of cyclic olefin.

As the copolymer of ethylene or α-olefin and cyclic olefin, for example, a polymer described in paragraphs 0030 to 0123 of WO2008/047468 can be used.

For example, it is a polymer having an alicyclic structure in at least a part of a repeating structural unit (hereinafter, also simply referred to as "a polymer having an alicyclic structure"), as long as it has the alicyclic structure in at least a part of the repeating structural unit. Specifically, it is preferable to include a polymer having one or more types of structure represented by Formula (1).

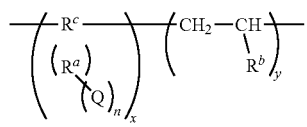
(1)

Here, in Formula (1), x and y represent a copolymerization ratio, and are real numbers satisfying $0/100 \leq y/x \leq 95/5$. x and y are on a molar basis.

n represents a substitution number of a substituent Q, and is a real number of $0 \leq n \leq 2$.

$R^a$ is a 2+n-valent group selected from the group consisting of hydrocarbon groups having 2 to 20 carbon atoms.

$R^b$ is a hydrogen atom or a monovalent group selected from the group consisting of hydrocarbon groups having 1 to 10 carbon atoms.

$R^c$ is a tetravalent group selected from the group consisting of hydrocarbon groups having 2 to 10 carbon atoms.

Q is $COOR^d$ ($R^d$ is a hydrogen atom or a monovalent group selected from the group consisting of hydrocarbon groups having 1 to 10 carbon atoms).

Each of $R^a$, $R^b$, $R^c$, and Q may be one type, and may include two or more types in any ratio.

In addition, in Formula (1), $R^a$ is preferably one or more types of a divalent group selected from hydrocarbon groups having 2 to 12 carbon atoms, still more preferably a divalent group represented by Formula (2) in a case where n=0, and most preferably a divalent group in which p is 0 or 1 in Formula (2). Only one type of the structure of $R^a$ may be used, or two or more types thereof may be used in combination.

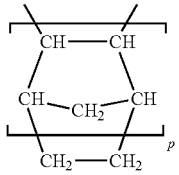
(2)

Here, in Formula (2), p is an integer of 0 to 2.

In addition, as the copolymer of ethylene or α-olefin and cyclic olefin, a cyclic olefin copolymer represented by Formula (3) is used. For example, a structural unit (A) derived from ethylene or linear or branched α-olefin having 3 to 30 carbon atoms and a structural unit (B) derived from a cyclic olefin are included.

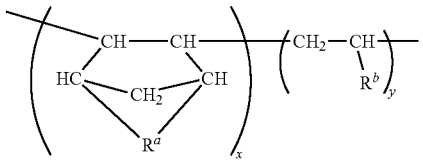
(3)

Here, in Formula (3), $R^a$ is a divalent group selected from the group consisting of hydrocarbon groups having 2 to 20 carbon atoms.

$R^b$ is a hydrogen atom or a monovalent group selected from the group consisting of hydrocarbon groups having 1 to 10 carbon atoms.

Each of $R^a$ and $R^b$ may be one type, and may include two or more types in any ratio.

x and y represent a copolymerization ratio, and are real numbers satisfying $5/95 \leq y/x \leq 95/5$, preferably $50/50 \leq y/x \leq 95/5$, and still more preferably $55/45 \leq y/x \leq 80/20$. x and y are on a molar basis.

The copolymer of ethylene or α-olefin and cyclic olefin is preferably a copolymer of the ethylene and the cyclic olefin. The cyclic olefin is preferably one or more selected from the group consisting of bicyclo[2.2.1]-2-heptene, tetracyclo[4.4.0.1$^{2,5}$.1$^{7,10}$]-3-dodecene, 1,4-methano-1,4,4a,9a-tetrahydrofluorene, cyclopentadiene-benzyne adduct, and cyclopentadiene-acenaphthylene adduct, and more preferably at least one selected from the bicyclo[2.2.1]-2-heptene and the tetracyclo[4.4.0.1$^{2,5}$.1$^{7,10}$]-3-dodecene.

As the copolymer of ethylene or α-olefin and cyclic olefin, a polymer obtained by hydrogenating the polymer having one or more types of structure represented by Formula (1) or the cyclic olefin copolymer represented by Formula (3) may also be used.

In addition, as the cyclic olefin polymer, it is possible to use the ring-opened polymer of the cyclic olefin.

Examples of the ring-opened polymer of the cyclic olefin include a ring-opened polymer of norbornene monomers, a ring-opened polymer of a norbornene monomer and other monomers capable of ring-opening copolymerization therewith, and a hydride thereof.

Examples of the norbornene monomer include bicyclo[2.2.1]hept-2-ene (common name: norbornene) and a derivative thereof (having a substituent on a ring), tricyclo[4.3.0$^{1,6}$.1$^{2,5}$]deca-3,7-diene (common name: dicyclopentadiene) and a derivative thereof, 7,8-benzotricyclo[4.3.0.1$^{2,5}$]deca-3-ene (common name: methanotetrahydrofluorene: also referred to as 1,4-methano-1,4,4a,9a-tetrahydrofluorene) and a derivative thereof, and tetracyclo[4.4.0.1$^{2,5}$.1$^{7,10}$]-3-dodecene (common name: tetracyclododecene) and a derivative thereof.

Examples of the substituent substituted on the ring of these derivatives include an alkyl group, an alkylene group, a vinyl group, an alkoxycarbonyl group, and an alkylidene group. One or more substituents can be provided. Examples of the derivative having the substituent on the ring include 8-methoxycarbonyl-tetracyclo[4.4.0.1$^{2,5}$1$^{7,10}$]dodeca-3-ene, 8-methyl-8-methoxycarbonyl-tetracyclo[4.4.0.1$^{2,5}$.1$^{7,10}$]dodeca-3-ene, and 8-ethylidene-tetracyclo[4.4.0.1$^{2,5}$1$^{7,10}$]dodeca-3-ene.

The norbornene monomer may be used alone and two or more kinds thereof may be used in combination.

The ring-opened polymer of the norbornene monomers or the ring-opened polymer of a norbornene monomer and other monomers capable of ring-opening copolymerization therewith can be obtained by polymerizing monomer components in presence of a known ring-opening polymerization catalyst.

As the ring-opening polymerization catalyst, for example, a catalyst including a halide of a metal such as ruthenium or osmium, a nitrate or an acetylacetone compound, and a reducing agent; a catalyst including a halide of a metal such as titanium, zirconium, tungsten, or molybdenum or an acetylacetone compound, and an organoaluminum compound; and the like can be used.

Examples of other monomers capable of ring-opening copolymerization with the norbornene monomer can include a monocyclic cyclic olefin monomer such as cyclohexene, cycloheptene, and cyclooctene.

The hydride of the ring-opened polymer of the norbornene monomers or the hydride of the ring-opened polymer of the norbornene monomer and other monomers capable of ring-opening copolymerization therewith can generally be obtained by adding a known hydrogenation catalyst containing transition metal such as nickel or palladium to a polymerization solution of the ring-opened polymer and hydrogenating carbon-carbon unsaturated bonds.

In the present embodiment, one kind of the cyclic olefin polymer may be used alone and two or more kinds thereof may be used in combination.

From the viewpoint of more improving the charge retention property and obtaining an electronic device more excellent in the sensitivity, a dielectric constant of the electretized film according to the present embodiment at a frequency of 1 MHz is preferably equal to or less than 3.0 and more preferably equal to or less than 2.5.

A content of the cyclic olefin polymer in the electretized film according to the present embodiment is not particularly limited, but is preferably equal to or more than 60% by mass, more preferably equal to or more than 70% by mass, still more preferably equal to or more than 80% by mass, particularly preferably equal to or more than 90% by mass, and preferably equal to or less than 100% by mass, when the entirety of the electretized film is set as 100% by mass.

Accordingly, it possible to obtain an electretized film which is more excellent in a balance of charge retention property at a high temperature or under a high temperature and high humidity, mechanical property, handleability, formability, flexibility, heat resistance, moisture resistance, transparency, and the like.

(Additive)

Various additives may be added to the electretized film according to the present embodiment according to a purpose. An addition amount of the additive is appropriately selected according to an application, within a range where the purpose of the present invention is not impaired.

Examples of the additive include one or more additives selected from the group consisting of resins other than the cyclic olefin polymers, a heat stabilizer, a weather stabilizer, a slip agent, a radiation inhibitor, a plasticizer, a lubricant, a release agent, a nucleating agent, a friction and wear improver, a flame retardant, an antistatic agent, a colorant, an antifogging agent, an antiblocking agent, an impact resistance agent, a surface wetting improver, a hydrochloric acid absorbent, and a metal deactivator.

In particular, in a case where a film is formed using, as a raw material, the copolymer of ethylene or α-olefin and a cyclic olefin as the cyclic olefin polymer and using an extruder or the like, gelation which causes a lump on a film appearance and is caused by friction between pellets in the extruder is further suppressed. Therefore, in a case where a solid raw material is a pellet, it is preferable to add a lubricant to an outside of the pellet in advance before supplying the pellet to the extruder.

Examples of the lubricant that suppresses the gelation due to friction or shear include a fatty acid amide lubricant or a metal soap lubricant, and a liquid lubricant. More specifically, the examples thereof include ethylene bis-stearic acid amide in a case of the fatty acid amide lubricant, calcium stearate or magnesium stearate, zinc stearate, and sodium stearate in a case of metal soap lubricant, and paraffin oil or naphthenic oil in a case of the liquid lubricant. An addition amount of the lubricant is preferably 0.005 to 0.3 parts by mass, more preferably 0.01 to 0.1 parts by mass, and still more preferably 0.03 to 0.08 parts by mass, relative to 100 parts by mass of the raw material pellets.

Here, when the addition amount of the lubricant is equal to or more than the lower limit value, an effect of the lubricant can be further easily obtained, and the generation can be further suppressed. On the other hand, when the addition amount of the lubricant is equal to or less than the upper limit value, the haze of the film is further reduced, and the transparency can be further favorable or the appearance or mechanical property can be further favorable. As a method of adding the lubricant to a pellet which is the solid raw material including the copolymer of ethylene or α-olefin and a cyclic olefin, the pellet and the lubricant may be homogeneously mixed using a mixer such as a tumbler mixer.

(Production Method of Electretized Film)

A production method of the electretized film according to the present embodiment includes the following two steps.

(1) Step of prepare a non-porous film including the cyclic olefin polymer (2) Step of subjecting the obtained non-porous film to a corona charge treatment to be electretized Hereinafter, the respective steps will be described.

First, the non-porous film including the cyclic olefin polymer is prepared.

The production method of the non-porous film including the cyclic olefin polymer is not particularly limited, and examples thereof include a method in which the cyclic olefin polymer according to the present embodiment is formed to have a film shape by using various known forming methods (cast forming, extrusion forming, inflation forming, injection forming, compression forming, calendar forming, and the like) to obtain the film.

Among the production method of the non-porous film, it is preferable to form a film by casting with a single screw extruder and a T-die, in a point of obtaining excellent mass productivity and reducing production costs. In particular, in a case where the cyclic olefin polymer is the copolymer of ethylene or α-olefin and cyclic olefin and a film which has high light transmittance and excellent in transparency with low haze is obtained by using the single screw extruder and the T-die, as film forming conditions, for example, a method described in Japanese Unexamined Patent Publication No. 2005-343148 can be referred to, including using in combination with a polymer filter. In addition, for the purpose of imparting film smoothness during casting, as a method of press-bonding a molten web extruded from the T die against a cast roll, a known electrostatic pinning method, a sleeve touch method having a mirror-finished surface (manufactured by CHIBA MACHINE INDUSTRY CORPORATION), and a method of press-bonding a known metal elastic roll can be used. Further, when the film is heat-stretched in a biaxial direction, the brittleness of the film may be improved. Here, examples of the method of heat-stretching the film in the biaxial direction can include a sequential stretching method and simultaneous biaxial stretching.

Next, the obtained non-porous film is subjected to a corona charge treatment, the non-porous film including the cyclic olefin polymer is electretized. The piezoelectric constant $d_{33}$ in the thickness direction is set to be equal to or more than the lower limit value. Accordingly, it is possible to obtain the electretized film according to the present embodiment. Here, as described above, in order to make the piezoelectric constant $d_{33}$ in the thickness direction equal to or more than the lower limit value, as will be described later, it is important to devise a method of corona charge treatment to the non-porous film including the cyclic olefin polymer.

More specifically, in order to obtain a non-porous film including the cyclic olefin polymer, in which the piezoelectric constant $d_{33}$ in the thickness direction is equal to or more than the lower limit, it is important to highly control three conditions: (1) performing the corona charge treatment by using a needle electrode in which needles are arranged with equal intervals, (2) a distance between electrodes during the corona charge treatment, and (3) a voltage during the corona charge treatment. That is, it is possible to obtain the non-porous film including the cyclic olefin polymer in which the piezoelectric constant $d_{33}$ in the thickness direction is equal to or more than the lower limit, for the first time by using the production method of highly controlling various factors related to the three conditions.

More specifically, the non-porous film is fixed between the needle electrodes connected to the DC high voltage power supply and an earth electrode, and a voltage is applied thereto. In this case, the distance between the needle electrode and the earth electrode is set to be 20 to 50 mm, and the voltage to be applied is set to be 15 to 30 kV or −30 to −15 kV.

Accordingly, it is possible to inject electric charges sufficiently into the non-porous film including the cyclic olefin polymer. It is possible to obtain the electretized film according to the present embodiment in which the piezoelectric constant $d_{33}$ in the thickness direction is equal to or more than the lower limit.

(Application)

The electretized film according to the present embodiment can be suitably used for an electronic device such as a piezoelectric panel (for example, a touch panel capable of detecting a touch pressure), a pressure sensor, a haptic device, a piezoelectric vibration power generator, an electrostatic induction power generator, a flat speaker, and an ultrasonic wave generator.

In particular, the electretized film according to the present embodiment can be used as a piezoelectric element or a pyroelectric element forming the electronic device.

<Electronic Device>

The electronic device according to the present embodiment includes the electretized film according to the present embodiment as one of the components.

The electronic device using the electretized film according to the present embodiment is suitable as an electronic device such as apiezoelectric panel (for example, a touch panel capable of detecting a touch pressure), a pressure sensor, ahaptic device, apiezoelectric vibration power generator, an electrostatic induction power generator, a flat speaker, and an ultrasonic wave generator.

In particular, the electretized film according to the present embodiment can be used as a piezoelectric element or a pyroelectric element forming the electronic device.

The electronic device includes, for example, a first electrode, the electretized film according to the present embodiment, and a second electrode in this order. The first electrode is disposed directly or indirectly on a main surface of the electretized film according to the present embodiment. The second electrode is disposed directly or indirectly on the other main surface of the electretized film according to the present embodiment.

Here, the number of the electretized films included in the electronic device can be one or more.

Examples of the first electrode and the second electrode include an indium tin oxide (ITO) electrode, a tin oxide electrode, a metal nanowire, a metal nanoparticle, and an organic conductive resin.

In the electronic device, the electretized film according to the present embodiment can convert electrical energy received through the first electrode and the second electrode into mechanical energy. Accordingly, the electretized film according to the present embodiment can be deformed and vibrate to give tactile feedback to the user.

In addition, in the electronic device, the electretized film according to the present embodiment can convert mechanical energy of the vibration received by the electronic device into electrical energy. The electrical energy is sent to another device or the like through the first electrode and the second electrode.

In addition, in the electronic device, the electretized film according to the present embodiment can convert electrical energy received through the first electrode and the second electrode into mechanical energy. Accordingly, the electretized film according to the present embodiment can be deformed and vibrate to generate sound.

The electronic device according to the present embodiment can be prepared, for example, based on known information.

Hereinabove, although the embodiment of the present invention has been described, these are examples of the present invention, and various configurations other than the above can be adopted.

In addition, the present invention is not limited to the above-described embodiments, and modifications, improvements, and the like within the scope where the purpose of the present invention can be achieved are included in the present invention.

EXAMPLES

Hereinafter, the present embodiment will be described in detail with reference to Examples and Comparative Examples. The present embodiment is not limited to the description of these Examples.

1. Measurement Method (1) Piezoelectric Constant $d_{33}$

The piezoelectric constant $d_{33}$ in a thickness direction of the electretized film was measured using a piezoelectric constant measuring device (Piezometer system PM300, manufactured by PIEZOTEST Pte. Ltd.) by applying a pressing force to the electretized film in the thickness direction, under conditions of a load of 0.5 N, a dynamic load of ±0.25 N, a frequency of 110 Hz, a temperature of 23° C., and a humidity of 50% The measurement was performed 5 times, and an average value thereof was adopted.

(2) Glass Transition Temperature

The glass transition temperature of the electretized film was measured using a differential scanning calorimetry (DSC) apparatus (DSC-60A, manufactured by Shimadzu Corporation).

(3) Moisture Permeance

The moisture permeance of the electretized film was measured under conditions of a temperature of 40° C. and a humidity of 90% RH by a cup method according to JIS Z 0208

(4) Water Absorptivity

A weight increase rate of the electretized film when immersed in water at a temperature of 23° C. for 24 hours (=100×Weight increase amount/Weight of electretized film before immersion) was measured as the water absorptivity, according to ASTM D570.

(5) Haze

The haze of the electretized film was measured using a haze meter (HAZE METER NDH 5000SP, manufactured by NIPPON DENSHOKU INDUSTRIES Co., LTD) according to JIS K 7136.

(6) Dielectric Constant

The dielectric constant of the electretized film at a frequency of 1 MHz was measured using a precision LCR meter (4284A, manufactured by Agilent).

(7) Charge Retention Property at High Temperature

A heat resistance test in which the electretized film was allowed to stand in a nitrogen atmosphere at 100° C. for 360 hours was performed. Here, the piezoelectric constant $d_{33}$ in the thickness direction of the electretized film was measured after 0 hours (before the heat resistance test), 100 hours, and 360 hours.

In this case, $D_1/D_0$ was calculated from the piezoelectric constant $d_{33}$ ($D_0$) in the thickness direction of the electretized film before the heat resistance test and the piezoelectric constant $d_{33}$ ($D_1$) in the thickness direction of the electretized film after 100 hours.

(8) Charge Retention Property Under High Temperature and High Humidity

A moisture and heat resistance test in which the electretized film was allowed to stand in an atmosphere of 85° C. and 85% RH for 100 hours was performed. Here, the piezoelectric constant $d_{33}$ in the thickness direction of the electretized film was measured after 0 hours, 24 hours, and 100 hours.

(9) Evaluation of Sensitivity of Electronic Device

Electrodes formed of aluminum foil were attached to both surfaces of the electretized film after the heat resistance test in which the electretized film was allowed to stand at 100° C. in a nitrogen atmosphere for 100 hours to prepare a sample for evaluation of sensor sensitivity. The obtained sample for evaluation of the sensor sensitivity was connected to an oscilloscope and pressure was repeatedly applied thereto with a finger in the thickness direction of the film. Generation of voltage was observed, and the sensor sensitivity was evaluated based on the following criteria.

o: Peak of voltage derived from pressure can be clearly identified x: Peak derived from pressure cannot be identified Example 1

Using a single screw extruder and a T-die cast forming device, 0.05 parts by mass of ethylene bis-stearic acid amide (Kao wax EB-FF, manufactured by Kao Corporation) as a lubricant was added to outside of 100 parts by mass of pellets formed of a cyclic olefin copolymer that includes ethylene and tetracyclo[$4.4.0.1^{2,5}.1^{7,10}$]-3-dodecene (content of ethylene: 69% by mole, content of tetracyclo [$4.4.0.1^{2,5}.1^{7,10}$]-3-dodecene: 31% by mole) and obtained one was subjected to extrusion forming. Accordingly, a non-stretched non-porous film including the cyclic olefin polymer was obtained.

Thereafter, the film was heated and stretched at a draw ratio of 2 times respectively in a longitudinal direction and in a lateral direction by a biaxial stretching machine to obtain a non-porous film having a thickness of 50 μm.

Next, the non-porous film was fixed between the needle electrode connected to the DC high voltage power supply and an earth electrode (distance between the electrodes: 35 mm). Here, for a device including a needle electrode connected to a DC high voltage power supply and an earth electrode, a DC high voltage power supply, a needle electrode, and an earth electrode manufactured by Kasuga Denki Co., Ltd. were used. Next, an electretized film was prepared by charging the non-porous film by applying a direct current high voltage (−20 kV) to the non-porous film for 5 seconds under an atmosphere of the temperature of 23° C. and humidity of 50% RH.

In addition, various evaluations were performed for each obtained electretized film. Obtained Results are shown in Table 1.

Example 2

The same operation as in Example 1 was performed except that the thickness of the film was changed to be 100 μm. Obtained Results are shown in Table 1.

Example 3

The same operation as in Example 1 was performed except that contents of the ethylene and the tetracyclo [$4.4.0.1^{2,5}.1^{7,10}$]-3-dodecene were changed such that the content of the ethylene was 63% by mole and the content of the tetracyclo[$4.4.0.1^{2,5}.1^{7,10}$]-3-dodecene was 37% by mole. Obtained Results are shown in Table 1.

Example 4

Using a single screw extruder and a T die cast forming device, pallets formed of the cyclic olefin copolymer (TOPAS 6013M-07 manufactured by Polyplastics Co., Ltd.) was extrusion formed. Accordingly, a non-stretched non-porous film including the cyclic olefin polymer, having a thickness of 75 μm was obtained.

Next, the non-porous film was fixed between the needle electrode connected to the DC high voltage power supply and an earth electrode (distance between the electrodes: 35 mm). Here, for a device including a needle electrode connected to a DC high voltage power supply and an earth electrode, a DC high voltage power supply, a needle electrode, and an earth electrode manufactured by Kasuga Denki Co., Ltd. were used. Next, an electretized film was prepared by charging the non-porous film by applying a direct current high voltage (−20 kV) to the non-porous film for 5 seconds under an atmosphere of the temperature of 23° C. and humidity of 50% RH.

In addition, various evaluations were performed for each obtained electretized film. Obtained results are shown in Table 1.

Comparative Example 1

Using a single screw extruder and a T-die cast forming device, 0.05 parts by mass of ethylene bis-stearic acid amide (Kao wax EB-FF, manufactured by Kao Corporation) as a lubricant was added to outside of 100 parts by mass of pellets formed of a cyclic olefin copolymer that includes ethylene and tetracyclo[4.4.0.1$^{2,5}$.1$^{7,10}$]-3-dodecene (content of ethylene: 69% by mole, content of tetracyclo [4.4.0.1$^{2,5}$.1$^{7,10}$]-3-dodecene: 31% by mole) and obtained one was subjected to extrusion forming. Accordingly, a non-stretched non-porous film including the cyclic olefin polymer was obtained. Thereafter, the film was heated and stretched at a draw ratio of 2 times respectively in a longitudinal direction and in a lateral direction by a biaxial stretching machine to obtain a non-porous film having a thickness of 50 μm.

Next, the non-porous film was fixed between a wire electrode with 0.05 mm of diameter, connected to the DC high voltage power supply and an earth electrode (distance between the electrodes: 7 mm). Here, a device including the wire electrode with 0.05 mm of diameter and the earth electrode which were used was ELCG-05 N2 (product name, manufactured by Element Co., Ltd.). Next, an electretized film was prepared by charging a non-porous film by applying a direct current high voltage (−8 kV) to the non-porous film for 60 seconds under an atmosphere of the temperature of 23° C. and humidity of 50% RH.

Various evaluations were performed for each obtained electretized film. Obtained results are shown in Table 1.

Comparative Example 2

The same operation as in Example 1 was performed except that a non-porous polyethylene terephthalate film was used as the film.

Obtained results are shown in Table 1.

Comparative Example 3

Various evaluations were performed on the porous polypropylene electretized film (EMFIT, manufactured by EMFIT, thickness of 90 μm) Obtained results are shown in Table 1.

TABLE 1

|  |  | Example 1 | Example 2 | Example 3 | Example 4 | Comparative Example 1 | Comparative Example 2 | Comparative Example 3 |
|---|---|---|---|---|---|---|---|---|
| Piezoelectric constant $d_{33}$ ($D_0$) [pC/N] |  | 267 | 254 | 259 | 260 | 97 | 80 | 84 |
| Glass transition temperature [° C.] |  | 125 | 125 | 145 | 142 | 125 | 67 | 10 |
| Moisture permeance [g · mm/m$^2$ · day] |  | 0.08 | 0.08 | 0.08 | 0.04 | 0.08 | 0.58 | 0.82 |
| Water absorptivity [% by mass] |  | <0.01 | <0.01 | <0.01 | <0.01 | <0.01 | 0.5 | 0.04 |
| Haze [%] |  | 0.4 | 0.4 | 0.4 | 0.8 | 0.4 | 0.6 | 50 |
| Dielectric constant |  | 2.3 | 2.3 | 2.2 | 2.2 | 2.3 | 3.1 | 2.3 |
| Charge retention property at high temperature | After 100 hours ($D_1$) [pC/N] | 259 | 242 | 267 | 210 | 55 | 22 | Not measurable |
|  | After 360 hours [pC/N] | 250 | 237 | 241 | 188 | 24 | 9 | Not measurable |
|  | $D_1/D_0$ | 0.97 | 0.95 | 1.03 | 0.81 | 0.57 | 0.28 | — |
| Charge retention property under high temperature and high humidity | After 24 hours [pC/N] | 188 | 164 | 200 | Not measured | 40 | 24 | Not measurable |
|  | After 100 hours [pC/N] | 124 | 121 | 145 | Not measured | Not measurable | Not measurable | Not measurable |
| Evaluation of sensitivity of electronic device |  | ○ | ○ | ○ | ○ | x | x | x |

As is clear from Table 1, it was found that the electretized films of Examples have high piezoelectric constant $d_{33}$ in the thickness direction, and are excellent in retention of the piezoelectric constant $d_{33}$ after the heat resistance test and the moisture and heat resistance test, and exhibit high sensitivity of a sensor.

Priority is claimed on Japanese Patent Application No. 2017-041001, filed on Mar. 3, 2017, the entire disclosure of which is incorporated herein.

The invention claimed is:
1. An electretized film comprising:
   a cyclic olefin polymer,
   wherein the electretized film is a non-porous film,
   a piezoelectric constant $d_{33}$ in a thickness direction, which is measured by applying a pressing force to the electretized film in the thickness direction, under conditions of a load of 0.5 N, a dynamic load of ±0.25 N, a frequency of 110 Hz, a temperature of 23° C., and a humidity of 50%, is equal to or more than 100 pC/N, and
   wherein when the electretized film is subjected to a heat resistance test in which the electretized film is allowed to stand in a nitrogen atmosphere at 100° C. for 100 hours, a piezoelectric constant $d_{33}$ in a thickness direction of the electretized film before the heat resistance test is set as $D_0$, and a piezoelectric constant $d_{33}$ in the thickness direction of the electretized film after the heat resistance test is set as $D_1$, $D_1/D_0$ is equal to or more than 0.60 and equal to or less than 1.1.

2. The electretized film according to claim 1,
wherein a content of an inorganic filler in the electretized film is equal to or less than 10% by mass when an entirety of the electretized film is set as 100% by mass.

3. The electretized film according to claim 1,
wherein a glass transition temperature of the electretized film is equal to or higher than 100° C. and equal to or lower than 220° C.

4. The electretized film according to claim 1,
wherein a moisture permeance of the electretized film, which is measured under conditions of a temperature of 40° C. and a humidity of 90% RH according to a moisture permeability test method (Cup Method) for moisture-resistant wrapping materials prescribed in JIS Z 0208, is equal to or less than 0.5 g·mm/m²·day.

5. The electretized film according to claim 1,
wherein water absorptivity of the electretized film when immersed in water at a temperature of 23° C. for 24 hours, which is measured according to a standard water absorption test method for plastics prescribed in ASTM $D_{570}$ is equal to or less than 0.1% by mass.

6. The electretized film according to claim 1,
wherein haze of the electretized film, which is measured according to a transparency test method for transparent materials prescribed in JIS K 7136, is equal to or less than 10%.

7. The electretized film according to claim 1,
wherein a dielectric constant of the electretized film at a frequency of 1 MHz is equal to or less than 3.0.

8. The electretized film according to claim 1,
wherein a thickness is equal to or more than 5 μm and equal to or less than 500 μm.

9. The electretized film according to claim 1, which is used for a piezoelectric panel, a pressure sensor, a haptic device, a piezoelectric vibration power generator, an electrostatic induction power generator, a flat speaker, or an ultrasonic wave generator.

10. An electronic device using the electretized film according to claim 1.

11. The electronic device according to claim 10, which is a piezoelectric panel, a pressure sensor, a haptic device, a piezoelectric vibration power generator, an electrostatic induction power generator, a flat speaker, or an ultrasonic wave generator.

* * * * *